(12) United States Patent
Yamamoto

(10) Patent No.: US 9,845,193 B2
(45) Date of Patent: Dec. 19, 2017

(54) CONVEYANCE SYSTEM

(71) Applicant: MURATA MACHINERY, LTD., Kyoto-shi, Kyoto (JP)

(72) Inventor: Makoto Yamamoto, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 604 days.

(21) Appl. No.: 14/390,420

(22) PCT Filed: Mar. 7, 2013

(86) PCT No.: PCT/JP2013/056346
§ 371 (c)(1),
(2) Date: Oct. 3, 2014

(87) PCT Pub. No.: WO2013/150859
PCT Pub. Date: Oct. 10, 2013

(65) Prior Publication Data
US 2015/0045937 A1 Feb. 12, 2015

(30) Foreign Application Priority Data

Apr. 5, 2012 (JP) ................................ 2012-086392

(51) Int. Cl.
*G06F 19/00* (2011.01)
*B65G 1/04* (2006.01)
(Continued)

(52) U.S. Cl.
CPC .............. *B65G 1/0421* (2013.01); *B65G 1/04* (2013.01); *B65G 1/137* (2013.01); *G05B 19/418* (2013.01);
(Continued)

(58) Field of Classification Search
None
See application file for complete search history.

(56) References Cited

U.S. PATENT DOCUMENTS

2002/0018705 A1* 2/2002 Kawaguchi .......... B65G 1/1373
414/274
2003/0113189 A1* 6/2003 Kaji ..................... G05B 19/042
414/217
(Continued)

FOREIGN PATENT DOCUMENTS

CN 1506257 A 6/2004
JP 09-315521 A 12/1997
(Continued)

OTHER PUBLICATIONS

Official Communication issued in International Patent Application No. PCT/JP2013/056346, dated May 28, 2013.
(Continued)

*Primary Examiner* — Philip Wang
(74) *Attorney, Agent, or Firm* — Keating & Bennett, LLP

(57) ABSTRACT

A conveyance system includes storage racks that are provided near or adjacent to semiconductor manufacturing devices and store therein objects to be conveyed, a stacker crane that carries the objects into and out of the storage racks, vehicles that convey the objects, an ID tag reader that is provided to the stacker crane and reads ID tags of the objects; and a controller that is configured or programmed to, when identification information acquired by the ID tag reader R coincides with identification information contained in a conveyance command of an object, control the stacker crane to convey the object to a destination specified in the conveyance command. At least one section of each storage rack allows a gripper of each vehicle to take in and out the objects.

3 Claims, 4 Drawing Sheets

(51) Int. Cl.
  *B65G 1/137* (2006.01)
  *H01L 21/67* (2006.01)
  *H01L 21/677* (2006.01)
  *G05B 19/418* (2006.01)

(52) U.S. Cl.
  CPC .. *H01L 21/67294* (2013.01); *H01L 21/67769* (2013.01); *B65G 2201/0297* (2013.01); *G05B 2219/45031* (2013.01)

(56) References Cited

U.S. PATENT DOCUMENTS

| | | |
|---|---|---|
| 2004/0109746 A1 | 6/2004 | Suzuki |
| 2006/0067809 A1 | 3/2006 | Ito |
| 2006/0080827 A1* | 4/2006 | Saito ............... B23P 21/004 29/592 |
| 2007/0296585 A1 | 12/2007 | Ishida et al. |
| 2009/0081009 A1 | 3/2009 | Yamamoto et al. |
| 2009/0235865 A1* | 9/2009 | Nakagawa ........ H01L 21/67276 118/696 |
| 2010/0228378 A1* | 9/2010 | Fukutomi ......... H01L 21/67766 700/112 |
| 2012/0306626 A1 | 12/2012 | Abe |
| 2013/0022429 A1 | 1/2013 | Ito |

FOREIGN PATENT DOCUMENTS

| | | |
|---|---|---|
| JP | 2000-118607 A | 4/2000 |
| JP | 2002-179203 A | 6/2002 |
| JP | 2010-058937 A | 3/2010 |
| WO | 2011/148412 A1 | 12/2011 |

OTHER PUBLICATIONS

Official Communication issued in corresponding European Patent Application No. 13772486.0, dated Dec. 8, 2015.

* cited by examiner

CONVEYANCE SYSTEM

BACKGROUND OF THE INVENTION

1. Field of the Invention

The present invention relates to a conveyance system.

2. Description of the Related Art

As a conventional conveyance system, a conveyance system described in Japanese Patent Application Laid-Open Publication No. 2002-179203, for example, is known. The conveyance system described in Japanese Patent Application Laid-Open Publication No. 2002-179203 includes a carrier that conveys a cassette on which an ID tag is attached, the carrier equipped with an ID reader that identifies the ID tag, and a station on which the cassette is placed, and the conveyance system controls conveyance of the cassette on the basis of the ID tag attached on the cassette.

As in the conveyance system described above in Japanese Patent Application Laid-Open Publication No. 2002-179203, controlling the cassette on the basis of the ID tag is effective from the viewpoint of accuracy and efficiency of conveyance. In recent years, faster processing in manufacturing semiconductor devices has been promoted, and shortening of a takeout time in a semiconductor manufacturing device has been required. At the same time, further speeding up of the time for conveying semiconductor wafers between processes has been required. In addition, recent upsizing of semiconductor wafers has increased the size of a front opening unified pod (FOUP, also referred to as a cassette) as a container that accommodates the semiconductor wafers. Accordingly, in a semiconductor manufacturing plant, more space is required for accommodating the FOUP than ever before, but securing space for accommodating the FOUP within a limited space is not easy.

SUMMARY OF THE INVENTION

Preferred embodiments of the present invention provide a conveyance system that secures a space to accommodate objects to be conveyed and also accurately and efficiently convey the objects.

A conveyance system according to one aspect of various preferred embodiments of the present invention is a conveyance system that conveys an object to be conveyed to which identification information that is uniquely identifiable is imparted. The conveyance system includes a storage rack that is provided near or adjacent to a semiconductor manufacturing device and stores therein the object, a stacker crane that carries the object into the storage rack and also carries the object out of the storage rack, an overhead carrier that travels along a track provided on a ceiling portion and raises and lowers a gripper that grips the object to convey the object, an identification-information acquisition unit configured to acquire the identification information imparted to the object, the identification-information acquisition unit being provided to the stacker crane, and a controller configured or programmed to, when the identification information acquired by the identification-information acquisition unit coincides with identification information contained in a conveyance command for the object, controlling the stacker crane to convey the object to a destination specified in the conveyance command. At least one section of the storage rack allows the gripper of the overhead carrier to take in and out the object.

In this conveyance system, the storage rack is provided that stores therein an object to be conveyed near the semiconductor manufacturing device. This secures a space to accommodate the object. In the conveyance system, because the storage rack is arranged near the semiconductor manufacturing device, transfer of the object between the storage rack and a loading port is performed quickly. In the conveyance system, the object can be taken into and out of at least one section of the storage rack by the gripper of the overhead carrier. In this manner, the conveying system is configured such that the overhead carrier accesses the storage rack, so that the storage rack defines and functions as a port to passing the object between the stacker crane and the overhead carrier. This enables the conveyance system to efficiently convey the object. Furthermore, in the conveyance system, when the identification information imparted to the object coincides with the identification information contained in the conveyance command, the stacker crane is controlled to convey the object to the destination specified in the conveyance command. This enables the conveyance system to convey the object accurately to a specified destination. As described above, the conveyance system secures a space to accommodate the object and also accurately and efficiently conveys the object.

In one preferred embodiment of the present invention, at a loading port of the semiconductor manufacturing device, the stacker crane and the overhead carrier are configured to carry in and out the object. This enables the overhead carrier to carry the object directly into and out of the loading port in the conveyance system. Accordingly, in the conveyance system, a time for temporarily storing the object to pass the object to the stacker crane is significantly shortened, and a time for transfer by the stacker crane is also significantly shortened such that the object is quickly conveyed. In the conveyance system, flexibility in transferring of the object is also improved. Thus, in the conveyance system, the efficiency of conveying the object is further improved.

According to various preferred embodiments of the present invention, a space that accommodates an object to be conveyed is secured, and also the object is accurately and efficiently conveyed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
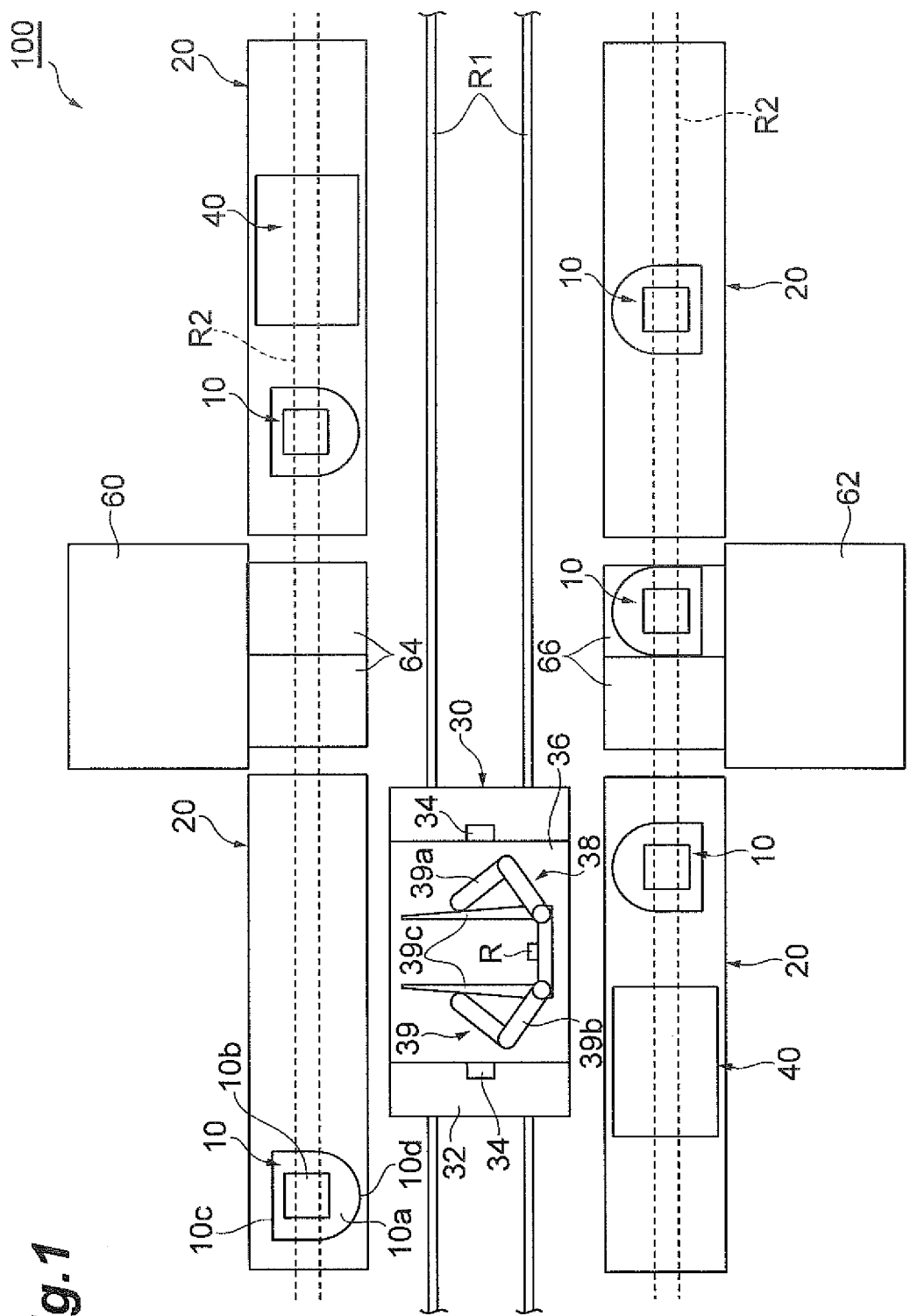
FIG. 1 is a plan view of a conveyance system according to a preferred embodiment of the present invention.

Preferred embodiments of the present invention will be described hereinafter in detail with reference to the drawings. In the drawings, like reference signs indicate like or corresponding components, and duplicate description is omitted.

Figure 2:
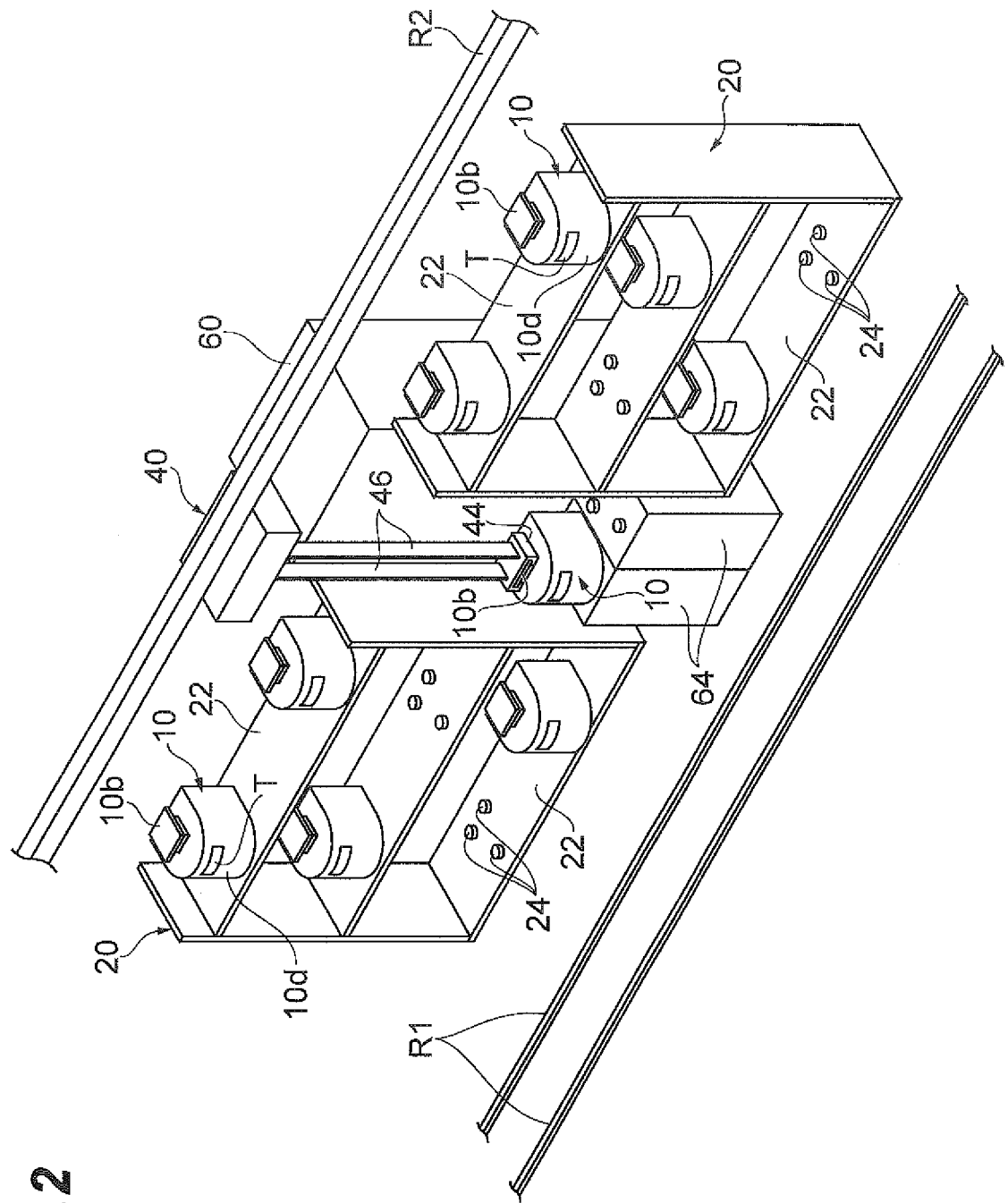
FIG. 2 is a perspective view illustrating the conveyance system depicted in FIG. 1.
Figure 3:
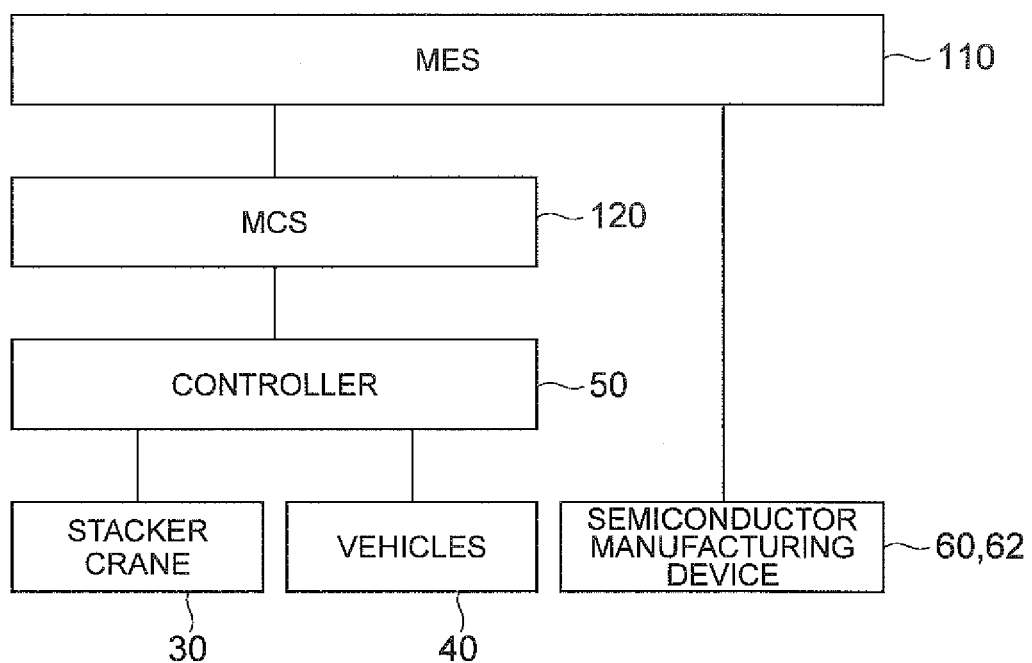
FIG. 3 is a block diagram illustrating a system configuration of the conveyance system.

FIG. 1 is a plan view of a conveyance system according to a preferred embodiment of the present invention. FIG. 2 is a perspective view illustrating the conveyance system depicted in FIG. 1. FIG. 3 is a block diagram illustrating a system configuration of the conveyance system.

A conveyance system 100 depicted in FIGS. 1 to 3 is provided in a clean room in which semiconductor devices are manufactured. The conveyance system 100 includes storage racks 20 that store therein objects 10 to be conveyed, a stacker crane 30, vehicles (overhead carriers) 40, and a controller (control device) 50. In the clean room, semiconductor manufacturing devices 60 and 62 are arranged. To the semiconductor manufacturing devices 60 and 62, loading ports 64 and 66 each are provided to carry the objects 10 into and out of the semiconductor manufacturing devices 60 and 62.

The conveyance system 100 further includes a manufacturing execution system (MES) 110 and a material control system (MCS) 120. The MCS 120 is a conveyance instruction device that provides instructions by preparing a conveyance schedule for the objects 10 on the basis of a semiconductor manufacturing schedule and sending a conveyance command based on this conveyance schedule to the controller 50 to which the stacker crane 30 and vehicles 40 are connected. As depicted in FIG. 3, the MCS 120 is a system that is provided between an interprocess conveyance facility such as the controller 50 and the MES 110 and has a function of transmitting various instructions from the MES 110 to the controller 50 at appropriate timings and compiling reports from the controller 50 to transmit them to the MES 110. The MES 110 is an integrated manufacturing information system that manages various kinds of information at the plant site in an integrated manner and performs information management for the MCS 120 and the semiconductor manufacturing devices 60 and 62.

The objects 10 preferably are cassettes (what are called front opening unified pods (FOUPs)) each accommodating a plurality of semiconductor wafers. An upper surface 10a of each object 10 is provided with a flange portion 10b that is held by a gripper 44 of each vehicle 40 described later. To aside (rear surface) 10c of each object 10, a removable lid (not depicted) is attached for semiconductor wafers to be taken in and out.

Identification information that is uniquely identified is provided for each object 10. In the present preferred embodiment, an ID tag T to which the identification information is provided is attached to each object 10. The ID tag T is arranged on a front surface 10d (surface opposite to the side 10c to which the lid is attached) of each object 10. The identification information that is imparted to each object 10 is not limited to the ID tag T, and may be a bar code, for example.

The storage racks 20 are racks that temporarily store therein the objects 10. The storage racks 20 are arranged near or adjacent to the semiconductor manufacturing devices 60 and 62. In the present preferred embodiment, the storage racks 20 are arranged with the loading ports 64 and 66 of the semiconductor manufacturing devices 60 and 62 interposed therebetween. In each storage rack 20, a plurality (herein, three rows in the height direction, for example) of placement shelves 22 on which the objects 10 are placed are provided. On each placement shelf 22, pins 24 are provided that protrude upward from the upper surface thereof. The pins 24 engage with positioning holes (not depicted) provided to the lower surface of each object 10. With these pins 24, the objects 10 are positioned in the storage rack 20. In each placement shelf 22, a gap is provided below the lower surface of each object 10 so that transfer arms 39c (described later) of the stacker crane 30 are capable of being inserted into the gap.

Upper portions of the storage racks 20 are open. In other words, the objects 10 can be taken into and out of at least one section of each storage rack 20 by the gripper 44 of each vehicle 40. In the storage racks 20, each object 10 is placed so that the front surface 10d thereof faces the stacker crane 30. Accordingly, each object 10 is arranged on one of the placement shelves 22 in such a manner that the ID tag T attached to the front surface 10d faces the stacker crane 30. The number and positions of the storage racks 20 to be installed are appropriately determined based on positions and the number of the installed semiconductor manufacturing devices 60 and 62 and the structure of the clean room. The storage racks 20 may be suspended from a ceiling, or may be fixed on a floor with supporting members, for example, interposed therebetween.

The stacker crane 30 includes a traveling truck 32 that travels along rails R1 in the clean room, two support post devices 34 that are installed upright on the traveling truck 32, an elevating platform 36 that is provided in a vertically movable manner with respect to the support post devices 34, a transfer device 38 that is installed on the elevating platform 36, and an ID tag reader (identification-information acquisition unit, see FIG. 1) R. The stacker crane 30 also includes a turntable (not depicted), for example, installed on the elevating platform 36.

The stacker crane 30 travels straight along the rails R1 constructed in the clean room. Between the semiconductor manufacturing devices 60 and 62 that are arranged facing each other, the rails R1 are constructed in the direction perpendicular or substantially perpendicular to this facing direction. In other words, the stacker crane 30 is configured to be a movable in the direction that is perpendicular or substantially perpendicular to the facing direction of the semiconductor manufacturing devices 60 and 62. The facing arrangement described herein does not necessarily have to indicate that the semiconductor manufacturing devices 60 and 62 completely face each other, and they may be arranged with a certain distance therebetween.

The transfer device 38 includes SCARA arms 39. Each SCARA arm 39 includes a base-end arm 39a, a front-end arm 39b, and a transfer arm 39c. Upper surfaces of transfer arms 39c constitute a transfer plane on which an object 10 is placed. The transfer arms 39c of the SCARA arms 39 move straight in the direction (direction in which each object 10 is taking in and taking out) perpendicular or substantially perpendicular to the traveling direction of the traveling truck 32.

The ID tag reader R is device that reads the ID tag T of each object 10 to acquire identification information. The ID tag reader R, which is provided to the transfer device 38, for example, reads the ID tag T attached to the object 10 to acquire the identification information before the object 10 stored in a storage rack 20 is conveyed (before being transferred to a loading port). The ID tag reader R outputs the acquired identification information to the controller 50. The position where the ID tag reader R is attached is not limited to a particular position as long as the ID tag T of each object 10 is capable of being read from the position.

The stacker crane 30 preferably operates as described below. Specifically, the stacker crane 30 stops in front of a certain storage rack 20, and takes out a certain one of the objects 10 that is stored in the storage rack 20, using the transfer arms 39c. Subsequently, the stacker crane 30 travels along the rails R1 riding on the traveling truck 32, and transfers the object 10 to the loading port 64 of the semiconductor manufacturing device 60, for example. Alternatively, the stacker crane 30 stops in front of the loading port 66 of the semiconductor manufacturing device 62, for example, and carries out one of the objects 10 that is placed on the loading port 66, using the transfer arms 39c. Subsequently, the stacker crane 30 travels to a destination (e.g., a storage rack 20) along the rails R1 riding on the traveling truck 32 to transfer the object 10.

The stacker crane 30 is configured to be rotatable by the turntable. Accordingly, the stacker crane 30 moves the SCARA arms 39 toward either of the semiconductor manufacturing device 60 and the semiconductor manufacturing device 62 by appropriately changing its direction with the turntable. In this manner, the stacker crane 30 carries the objects 10 into and out of the respective loading ports 64 and 66 of the semiconductor manufacturing devices 60 and 62 that are arranged facing each other. Such conveying operations of the objects 10 performed by the stacker crane 30 are controlled by the controller 50.

In FIG. 1, only one stacker crane 30 is illustrated, but the stacker crane 30 may be provided singly or in plurality on the rails R1.

The vehicles 40 each preferably are an overhead hoist transport (OHT) and convey an object 10 along travelling rails (track) R2 suspended from a ceiling portion. The travelling rails R2 are installed on the ceiling of the clean room, and are arranged above the loading ports 64 and 66 of the semiconductor manufacturing devices 60 and 62.

Each vehicle 40 includes the gripper 44. The gripper 44 holds an object 10 by gripping the flange portion 10b. The gripper 44 descends from a certain position when a plurality of belts 46 are synchronously paid out by a hoisting unit (not depicted). The gripper 44 also ascends to a certain position when the belts 46 are synchronously taken up by the hoisting unit.

Each vehicle 40 operates as described below. Specifically, the vehicle 40 conveys an object 10 from a source (e.g., a stocker for objects to be conveyed), stops above the loading port 64 of the semiconductor manufacturing device 60, for example, and lowers the thus conveyed object 10 to place the object 10 on the loading port 64. The vehicle 40 also conveys an object 10 from a source, stops above a certain storage rack 20, and lowers the thus conveyed object 10 to place the object 10 at a certain position of the storage rack 20.

The vehicle 40 also stops above the loading port 66 of the semiconductor manufacturing device 62, for example, grips an object 10 placed on the loading port 66 with the gripper 44, and raises the object 10 in this gripping state to convey the object 10 to a certain destination. The vehicle 40 also stops above a storage rack 20, for example, grips an object 10 stored in the storage rack 20 with the gripper 44, and raises the object 10 in this gripping state to convey the object 10 to a certain destination.

The controller 50 is configured or programmed to control the stacker crane 30 and the vehicles 40. The controller 50 is configured or programmed to communicate with the ID tag reader R provided to the stacker crane 30. The controller 50 is configured or programmed to receive identification information output from the ID tag reader R of the stacker crane 30 and a conveyance command output from the MCS 120, and determine whether the identification information coincides with identification information contained in the conveyance command. The conveyance command includes at least identification information to identify an object 10 and destination information that indicates a destination of the object 10.

If the identification information of the object 10 coincides with the identification information in the conveyance command, the controller 50 is configured or programmed to control the stacker crane 30 to convey the object 10 to the destination that is indicated by the destination information contained in the conveyance command. Accordingly, the stacker crane 30 transfers the object 10 to a certain destination in response to the conveyance command. If the identification information of the object 10 does not coincide with the identification information in the conveyance command, the controller 50 controls the stacker crane 30 to convey the object 10 to a destination (e.g., a rack that temporarily stores therein the object 10) that is different from the destination in the conveyance command.

Figure 4:
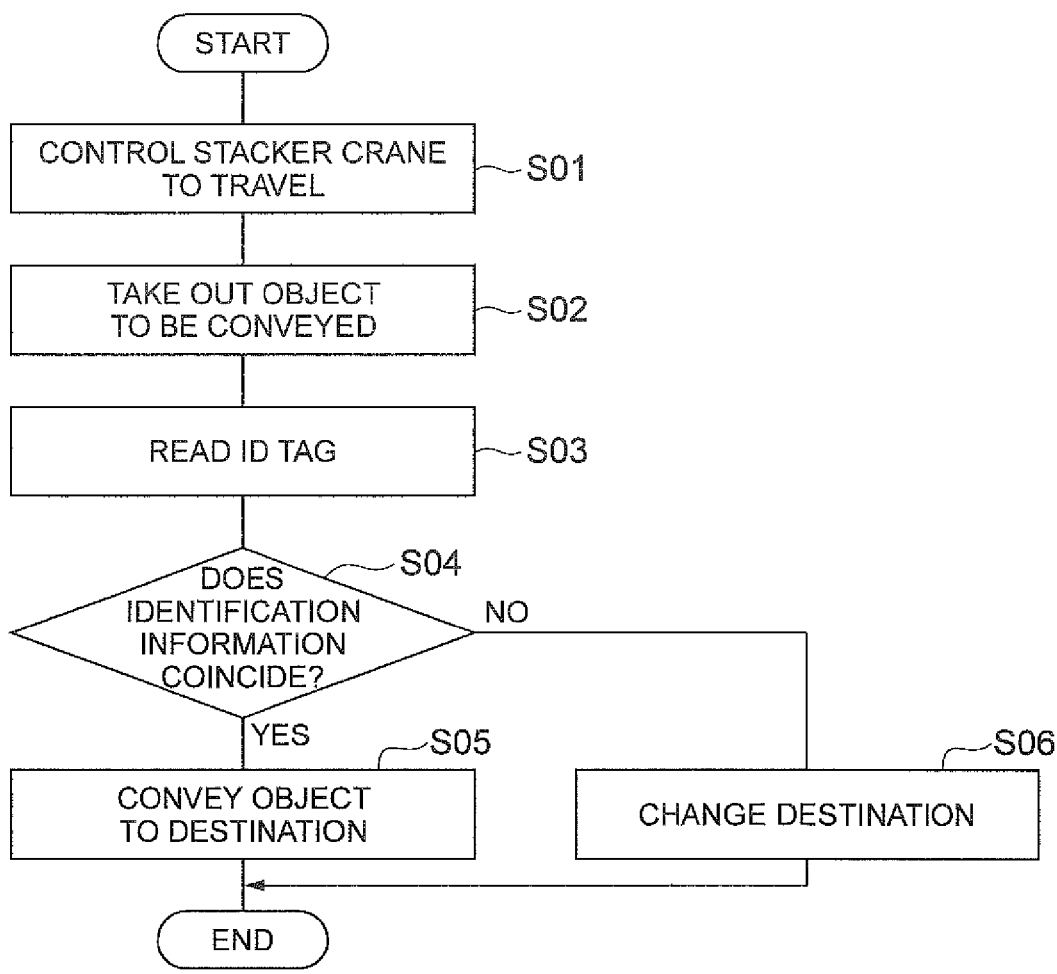
FIG. 4 is a flowchart illustrating operations of the conveyance system.

Operations of the conveyance system 100 will be described hereinafter with reference to FIG. 4. FIG. 4 is a flowchart illustrating the operations of the conveyance system. One example is described below in which an object 10 stored in a storage rack 20 is conveyed to the loading port 64 of the semiconductor manufacturing device 60.

As depicted in FIG. 4, controlled by the controller 50 on the basis of a conveyance command, the stacker crane 30 travels to the front of a certain object 10 in a storage rack 20 (step S01). Next, the object 10 is taken out of the storage rack 20 with the transfer arms 39c of the transfer device 38 of the stacker crane 30 (step S02). At this time, the ID tag T of the object 10 is read by the ID tag reader R (step S03).

Subsequently, the controller 50 determines whether the identification information of the ID tag T read by the ID tag reader R coincides with identification information contained in the conveyance command (step S04). If it is determined that the identification information of the ID tag T coincides with the identification information contained in the conveyance command, the stacker crane 30 is controlled by the controller 50 to convey the object 10 to the loading port 64 (step S05). If it is not determined that the identification information of the ID tag T coincides with the identification information contained in the conveyance command, the stacker crane 30 is controlled by the controller 50 to convey the object 10 to another certain destination (step S06).

As described above, in the present preferred embodiment, the storage racks 20 are arranged near the semiconductor manufacturing devices 60 and 62. With these storage racks 20, a space that accommodates objects 10 is secured. In addition, this arrangement of the storage racks 20 near the semiconductor manufacturing devices 60 and 62 enables the objects 10 to be quickly transferred between the storage racks 20 and the loading ports 64 and 66.

Furthermore, in the present preferred embodiment, the ID tag T of an object 10 stored in a storage rack 20 is read by the ID tag reader R of the stacker crane 30 and, if the identification information thus read coincides with identification information contained in a conveyance command, the controller 50 controls the stacker crane 30 to convey the object 10 to a destination specified by the conveyance command. In this manner, in the present preferred embodiment, objects 10 are identified in the controller 50 that controls the stacker crane 30, and thus processing speed is improved compared with a conventional system in which, for example, identification information of an object 10 is acquired at a loading port, the identification information is output to the MES 110, and the object 10 is identified by the MES 110. Thus, objects 10 are quickly and accurately conveyed to destinations. In addition, because the ID tag reader R is provided to the stacker crane 30, the necessity of providing ID tag readers to the storage racks 20 and the loading ports 64 and 66 is eliminated, such that the structure is greatly simplified and the cost is significantly reduced.

In the present preferred embodiment, the vehicles 40 directly carry in and out objects 10 at the loading ports 64 and 66. For example, when an object 10 for an urgent lot requiring immediate processing is conveyed, conventionally, the object 10 is conveyed to and placed on a certain port by a vehicle 40, and later the object 10 is conveyed to a certain loading port by the stacker crane 30. This inevitably requires time to convey the object 10.

In contrast, because the present preferred embodiment enables objects 10 to be directly conveyed into and out of the loading ports 64 and 66 by the vehicles 40 without the stacker crane 30, a time required to temporarily store the objects 10 and a transfer time by the stacker crane 30 is significantly shortened. Thus, the conveyance times of the objects 10 are shortened, and the objects 10 are quickly conveyed. In addition, the flexibility of conveyance of the objects 10 is greatly improved. As described above, the present preferred embodiment improves the efficiency of conveying the objects 10.

In the present preferred embodiment, the upper portions of the storage racks 20 preferably are open. This enables the vehicles 40 to take in and out the objects 10 at the storage racks 20. Thus, the storage racks 20 define and function as ports configured to pass the objects 10 between the stacker crane 30 and the vehicles 40. This enables the objects 10 to be more efficiently conveyed.

From another viewpoint, the present preferred embodiment provides a conveyance system that conveys an object to be conveyed to which identification information that is uniquely identifiable is imparted. The conveyance system includes a storage rack that is provided near or adjacent to a semiconductor manufacturing device and stores therein the object, a stacker crane that carries the object into the storage rack and also carries the object out of the storage rack, an overhead carrier that travels along a track provided on a ceiling portion and raises and lowers a gripper that grips the object to convey the object, an ID tag reader that is provided to the stacker crane and acquires the identification information imparted to the object, and a controller that is configured or programmed to, when the identification information acquired by the ID tag reader coincides with identification information contained in a conveyance command for the object, control the stacker crane to convey the object to a destination specified in the conveyance command. At least one section of the storage rack allows the gripper of the overhead carrier to take in and out the object.

The present invention is not limited to the above-described preferred embodiment. For example, in the above-described preferred embodiment, a configuration has been described as one example in which two semiconductor manufacturing devices 60 and 62 preferably are provided, but the installation number of semiconductor manufacturing devices, for example, may be appropriately determined depending on the design of a semiconductor manufacturing plant. An interbay stocker may be provided that temporarily stores therein the objects 10. The stacker crane 30 and the vehicles 40 are configured to access the interbay stocker.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A conveyance system that conveys an object to be conveyed to which identification information that is uniquely identifiable is provided, the conveyance system comprising:
   a storage rack that is provided near or adjacent to a semiconductor manufacturing device and is configured to store therein the object;
   a stacker crane configured to carry the object into the storage rack and to carry the object out of the storage rack;
   an overhead carrier configured to travel along a track provided on a ceiling portion and raise and lower a gripper that grips the object to convey the object;
   an identification-information acquisition unit configured to acquire the identification information imparted to the object, the identification-information acquisition unit being provided to the stacker crane; and
   a controller configured or programmed to, when the identification information acquired by the identification-information acquisition unit coincides with identification information contained in a conveyance command for the object, control the stacker crane to convey the object to a destination specified in the conveyance command; wherein
   at least one section of the storage rack allows the gripper of the overhead carrier to take in and out the object; and
   at a loading port of the semiconductor manufacturing device, the stacker crane and the overhead carrier are able to carry in and out the object.

2. A conveyance system comprising:
   a stacker crane configured to carry objects to be conveyed into loading ports of semiconductor manufacturing devices and to carry the objects out of the loading ports;
   overhead carriers configured to raise and lower grippers that grip the objects to convey the objects; and
   storage racks that are provided near or adjacent to the semiconductor manufacturing devices, and are configured to store therein the objects and also allow the stacker crane to take in and out the objects, the storage racks each being arranged on at least one of the right side and the left side of each of the loading ports; wherein
   the stacker crane and the overhead carriers are configured to take in and out the objects at the loading ports;
   at least one section of each of the storage racks is configured to allow the grippers of the overhead carriers to take in and out the objects, and to function as a port configured to pass each of the objects between the stacker crane and at least one of the overhead carriers;
   the stacker crane is configured to travel in a horizontal direction in front of the loading ports and the storage racks; and
   the overhead carriers are configured to travel along tracks constructed above the loading ports and the storage racks.

3. The conveyance system according to claim 2, wherein
   the semiconductor manufacturing devices are arranged facing each other with a certain distance interposed therebetween; and
   the stacker crane is configured to travel in a direction that is perpendicular or substantially perpendicular to a facing direction between the semiconductor manufacturing devices facing each other and to carry each of the objects into and out of either of the loading ports of the semiconductor manufacturing devices.

* * * * *